(12) United States Patent
Mitome et al.

(10) Patent No.: US 7,479,835 B2
(45) Date of Patent: Jan. 20, 2009

(54) CONSTANT TEMPERATURE TYPE CRYSTAL OSCILLATOR FOR HIGH STABILITY

(75) Inventors: Hiroyuki Mitome, Saitama (JP); Manabu Ito, Saitama (JP); Takeshi Uchida, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 101 days.

(21) Appl. No.: 11/518,768

(22) Filed: Sep. 11, 2006

(65) Prior Publication Data

US 2007/0057742 A1  Mar. 15, 2007

(30) Foreign Application Priority Data

Sep. 15, 2005  (JP) .............................. 2005-268325

(51) Int. Cl.
*H03B 1/00* (2006.01)
(52) U.S. Cl. .......................... 331/69; 331/158; 331/176
(58) Field of Classification Search .................. 331/65, 331/66, 68, 69, 116 R, 158, 176; 310/343
See application file for complete search history.

(56) References Cited

U.S. PATENT DOCUMENTS

| 3,757,245 A | * | 9/1973 | Berger | 331/66 |
| 4,861,168 A | * | 8/1989 | Ziegler et al. | 374/117 |
| 5,703,542 A | * | 12/1997 | Blandino | 331/70 |
| 2005/0082377 A1 | * | 4/2005 | Kato et al. | 236/72 |
| 2005/0258913 A1 | * | 11/2005 | Ito et al. | 331/158 |

FOREIGN PATENT DOCUMENTS

| JP | H01-195706 | 8/1999 |
| JP | 2005-124129 | 5/2005 |

* cited by examiner

*Primary Examiner*—Robert Pascal
*Assistant Examiner*—Ryan J. Johnson
(74) *Attorney, Agent, or Firm*—Scott D. Wofsy; Edwards Angell Palmer & Dodge LLP

(57) ABSTRACT

A constant temperature oscillator includes a crystal oscillator that is provided upright on a circuit board, an oscillation element arranged on the circuit board and configuring an oscillation circuit in conjunction with the crystal oscillator, and a temperature control element including a heating chip resistance and a thermistor, arranged on the circuit board, and configuring a temperature control circuit that keeps an operating temperature of the crystal oscillator constant, and which is provided with a heat transfer plate between the heating chip resistance and the bottom face of the oscillator container, wherein the heat transfer plate has a notch into which the heating chip resistance is fitted, and a heat sink lies between the heat transfer plate and the heating chip resistance and closely contacts with them.

6 Claims, 5 Drawing Sheets

CONSTANT TEMPERATURE TYPE CRYSTAL OSCILLATOR FOR HIGH STABILITY

BACKGROUND OF INVENTION

The present invention relates to a constant temperature type crystal oscillator (referred to hereunder as a "constant temperature oscillator") for high stability, which uses a heating chip resistance, and in particular to a constant temperature oscillator having a heat transfer plate which improves the heat transfer efficiency between a crystal oscillator and the heating chip resistance.

In a constant temperature oscillator frequency stability is demanded. For example, constant temperature oscillators it are applied to base stations for mobile communications, and generally employ a constant temperature oven which makes the operating temperature of the crystal oscillator constant. Recently, with the miniaturization of electronic equipment including telecommunication devices incorporating such oscillators, the size of the constant temperature oscillator itself is required to be further miniaturized, particularly the height of the oscillator is required to be lower to make the oscillator thinner.

BACKGROUND ART

FIG. 7 is a sectional view of a conventional constant temperature oscillator (Japanese Unexamined Patent Publication No. H01-195706). The constant temperature oscillator here is a double-decked structure comprising a first circuit board 7A and a second circuit board 7B positioned vertically. The first circuit board 7A and the second circuit board 7B are hermetically sealed in an oscillator housing comprising a base 10 and a cover 9. The first circuit board 7A is held by hermetic terminals (airtight terminals) 8A. The second circuit board 7B is held by metal pins 8B implanted in the first circuit board 7A.

Temperature control elements 15 that form a temperature control circuit, are primarily located on the both main surfaces of the first circuit board 7A, and oscillation elements 14 that form an oscillation circuit are primarily located on the both main surfaces of the second circuit board 7B. Also, a crystal oscillator 1 that is covered with a constant temperature oven 12, is located between opposing surfaces of the first circuit board 7A and the second circuit board 7B. The opening face side of the constant temperature oven 12 is anchored onto the second circuit board 7B. A heating coil 13 is wound on the periphery of the constant temperature oven 12, and a thermistor 6 that detects the oven temperature, is provided on the outer surface of the heating coil 13. Moreover, the closed end side of the constant temperature oven 12 closely contacts a power transistor 5 that is located on the first circuit board 7A.

In such a constant temperature oscillator, by means of the temperature control circuit comprising the temperature control elements 15 including the power transistor 5 and the thermistor 6, that is to say, by controlling the electric current from the power transistor 5 to the heating coil 13 based on the temperature detected by the thermistor 6, the operating temperature of the crystal oscillator 1 which particularly has a frequency temperature behavior, is maintained constant. In general, the operating temperature of the crystal oscillator 1 (AT cut) is set to a local minimum value (e.g. 70° C.) on the higher temperature side of the frequency temperature characteristics that becomes a cubic curve. As a result, the frequency variation of the crystal oscillator can be maintained at around 0.05 ppm.

FIG. 8 is a view of another conventional example of a constant temperature oscillator (Japanese Unexamined Patent Publication No. 2005-124129), being in particular an exploded view of a constant temperature oscillator that does not contain a heating coil 13 which requires a winding operation and thus requires man-power and costs. The constant temperature oven 12 has an accommodating portion 12a into which the crystal oscillator 1 is inserted from one end side thereof, and a pair of leg portions 12b that form a cavity portion 12c extends from the one main surface.

Moreover, on a central region of a circuit board 7, for example three heating chip resistances 4 are provided in parallel, and between these are positioned a thermistor 6 being a highly sensitive thermal element, and a voltage variable capacitance element 14A as one of the oscillation elements 14. A pair of metal patterns 16 serving as heat transfer plates, are formed in parallel on the circuit board 7, and electrodes at both ends of the heating chip resistances 4 are connected and anchored thereto. Temperature control elements 15 including power transistors 5, are positioned on the peripheral portion of the circuit board 7.

A heat sink sheet 3 is installed on the heating chip resistance 4, and the leg portions 12b of the constant temperature oven 12 are anchored on the metal patterns 16. As a result, heating chip resistances 4 and so on are accommodated in a cavity portion 12c between the leg portions 12b of the constant temperature oven 12. In this case, the heat sink sheet 3 is closely contacted with the heating chip resistances 4 and the one main surface of the constant temperature oven 12 from which the leg portions 12b extend. The rest of the oscillation elements 14 and the temperature control elements 15 are located on both of the main surfaces of the circuit board 7 and are accommodated in the housing of the oscillator.

In such a constant temperature oscillator, because the heat sink sheet 3 lies between the constant temperature oven 12 and the heating chip resistances 4 and closely contacts with them, the thermal coupling between the constant temperature oven 12 and the crystal oscillator 1 can be enhanced. Also the metal patterns 16 are provided on the circuit board 7 enhancing the thermal coupling between the heating chip resistances 4 and the constant temperature oven 12. According to these configurations, the heat generated from the heating chip resistances 4 is effectively transferred to the crystal oscillator 1 improving the heat transfer efficiency. Therefore, without using the aforementioned constant temperature oven 12 having the heating coil 13, a constant temperature oscillator in which the operating temperature is maintained constant can be obtained.

Also, because the circuit board 7 is a single form on which the oscillation elements 14 and the temperature control elements 15 are mounted, compared to the aforementioned case of the double-decked structure shown in FIG. 7 in which the temperature control elements are located on the first circuit board 7A and the oscillation elements 14 are located on the second circuit board 7B, thinning the overall size of the oscillator can be realized.

PROBLEMS TO BE SOLVED BY THE INVENTION

However, the constant temperature oscillators of the aforementioned configurations have a problem in that, in both of the cases shown in FIG. 7 and FIG. 8, the use of the constant temperature oven 12 inhibits miniaturizing, particularly thinning. Particularly, in the constant temperature oven 12 having the heating coil 13 (refer to FIG. 7), the heat loss is significant because the heat is radiated from the heating coil 13 not only inwardly but also outwardly. Also, in the constant temperature oven 12 having leg portions (refer to FIG. 8), forming the leg portions is costly.

It is, therefore, an object of the present invention to provide a constant temperature oscillator that promotes miniaturizing, particularly thinning by realizing improvement of the heat transfer.

SUMMARY OF INVENTION

Figure 1:
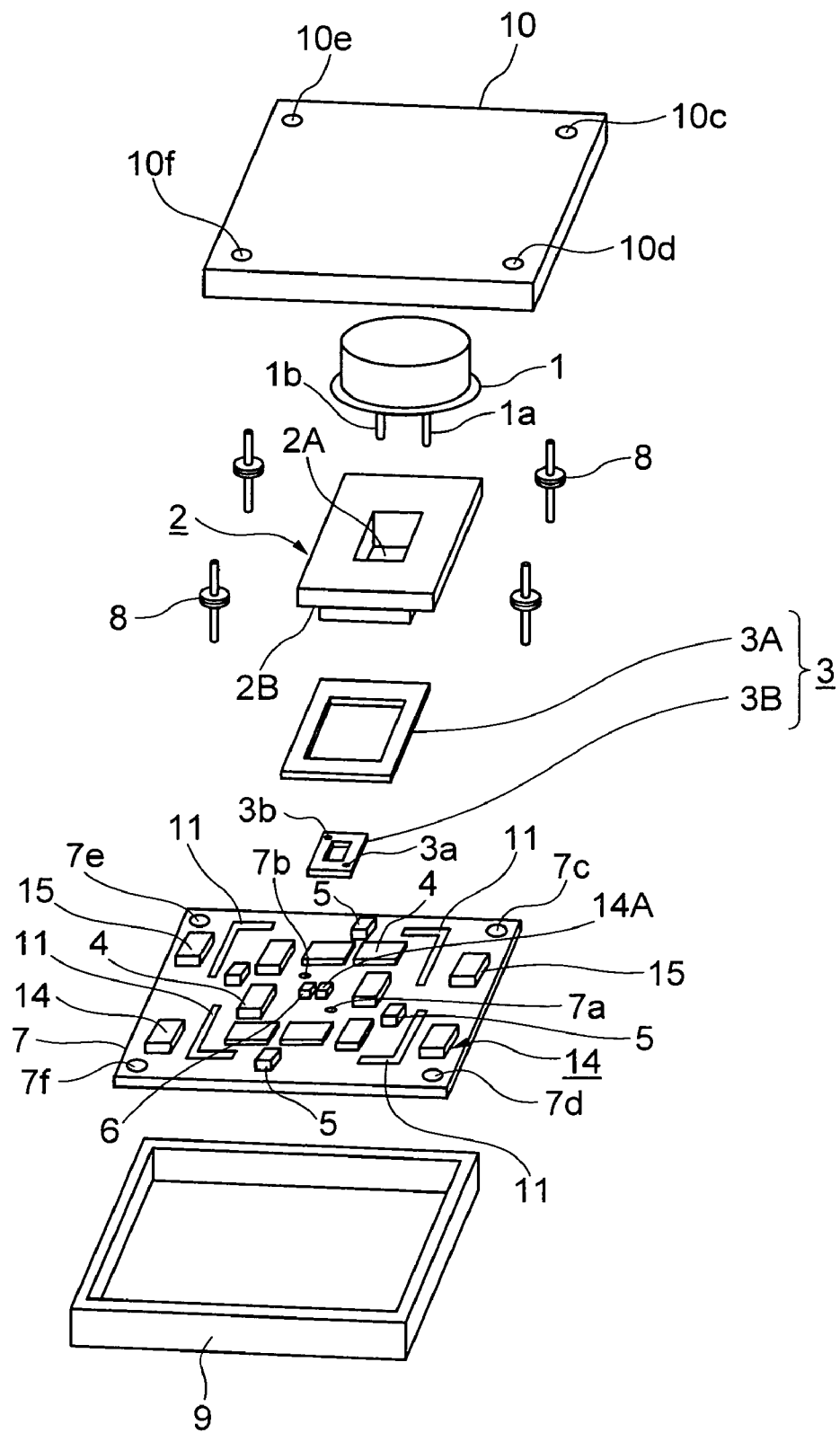
FIG. 1 is an exploded view showing a first embodiment of a constant temperature oscillator of the present invention.

The present invention is a constant temperature oscillator which comprises: a crystal oscillator that is provided upright on a circuit board, and which comprises a plurality of lead wires extending out from a bottom face of an oscillator container in which a crystal piece is hermetically sealed; an oscillation element arranged on the circuit board and configuring an oscillation circuit in conjunction with the crystal oscillator; and a temperature control element including at least a heating chip resistance and a thermistor, arranged on the circuit board, and configuring a temperature control circuit that keeps an operating temperature of the crystal oscillator constant; and which is provided with a heat transfer plate between the heating chip resistance and the bottom face of the oscillator container, wherein, the heat transfer plate has a notch into which the heating chip resistance is fitted, and a heat sink lies between the heat transfer plate and the heating chip resistance and closely contacts with them.

According to such a configuration, since the heat transfer plate is provided between the heating chip resistance and the bottom face of the oscillator container, the conventional constant temperature oven (oscillator container) in which the crystal oscillator is accommodated can be omitted. Therefore, thinning of the constant temperature oscillator can be facilitated because only the thickness of the heat transfer plate basically adds to the height dimension. Also, here since the heating chip resistance is fitted into the notch provided in the heat transfer plate, the upper and side faces of the heating chip resistance and the notch of the heat transfer plate become opposing faces. Furthermore, because the heat sink is sandwiched between and in close contact with the heating chip resistance and the notch of the heat transfer plate, the heat from the heating chip resistance is directly supplied to the heat transfer plate. Therefore, the heat from the heating chip resistance is supplied to the heat transfer plate without loss, and the oscillator container is heated.

According to the present invention, the notch is provided in a peripheral portion of the heat transfer plate in an annular shape, and a plurality of the heating chip resistances is evenly arranged around the notch. As a result, the bottom face of the oscillator container is supplied with heat evenly without deviation, and a stable temperature distribution can be maintained.

Furthermore, according to the present invention, the heating chip resistance is configured such that a plurality thereof is connected between a power transistor and a power supply in parallel, in series, or in series-parallel. As a result, compared for example to the case in which a single heating chip resistance is connected to a power transistor, the heat is dispersed and a uniform temperature distribution on the bottom face of the oscillator container can be realized.

Moreover, according to the present invention, a plurality of heating chip resistances and a plurality of sets of the power transistors are arranged on the circuit board. As a result, a uniform temperature distribution on the bottom face of the oscillator container can be further realized, compared to the case with a single set of the combination of a plurality of heating chip resistances and a power transistor.

Furthermore, according to the present invention, the heat sink is sheet-shaped having elasticity. As a result, the contact with the heating chip resistance and the notch of the heat transfer plate can be further increased, improving the heat transfer characteristics.

DETAILED DESCRIPTION OF THE PREFERRED EMBODIMENT

First Embodiment

Figure 2:
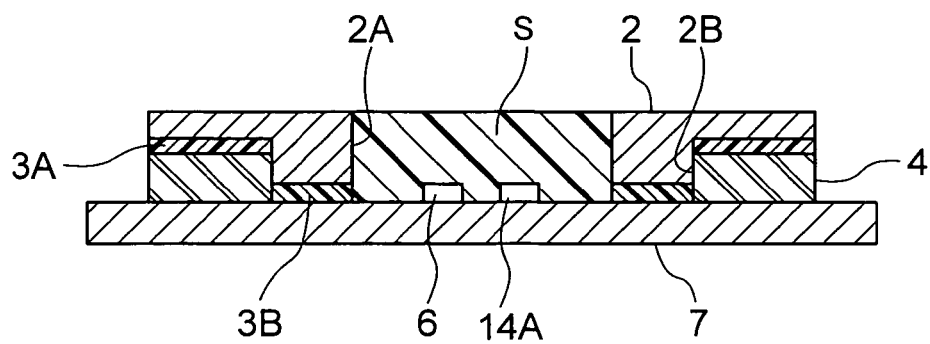
FIG. 2 is a sectional view of the main parts of a heat transfer plate in the first embodiment of the constant temperature oscillator of the present invention.
Figure 3:
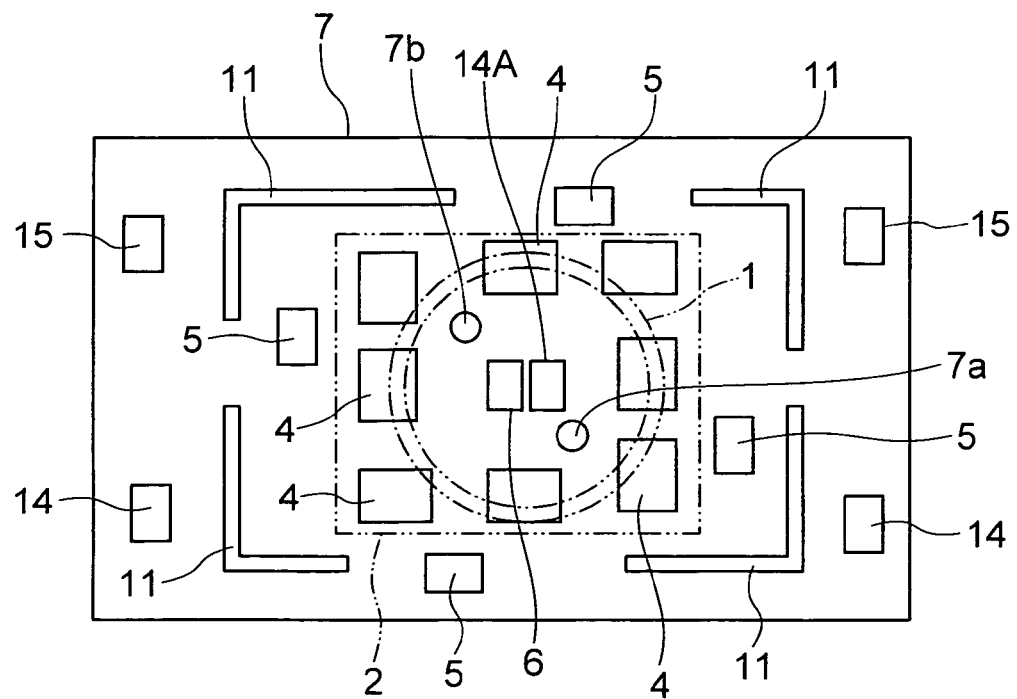
FIG. 3 is a top view of a circuit board of the first embodiment of the present invention.

FIG. 1 to FIG. 3 are explanatory drawings of an embodiment of a constant temperature oscillator of the present invention, in which FIG. 1 is an exploded view of the assembly, FIG. 2 is a partial sectional view, and FIG. 3 is a top view without a cover.

As shown in FIG. 1, in the constant temperature oscillator of the present invention, a crystal oscillator 1, oscillation elements 14, and temperature control elements 15 are arranged on a circuit board 7. Furthermore, instead of the conventional constant temperature oven 12, it has a heat transfer plate 2 and a heat sink 3, and these are hermetically sealed in an oscillator container comprising a base 10 and a cover 9. The circuit board 7 of this embodiment is, for example, provided with cuts 11 surrounding the central region thereof.

The crystal oscillator 1 comprises a crystal piece (not shown) hermetically sealed in an oscillator container of, for example, a TO8 type, and lead wires 1$a$ and 1$b$ led from the bottom face thereof. Furthermore, the crystal oscillator 1 is provided upright on the central region of the circuit board 7 surrounded by the cuts 11. The circuit board 7 is held by airtight terminals 8 serving as external terminals of the base 10 (shown in FIG. 1). For descriptive convenience, the vertical direction in FIG. 1 is flipped in comparison to the orientation in use.

Of the components of the oscillation elements 14, a voltage variable capacitance element 14A, which is a highly sensitive thermal element having a high characteristic change with respect to temperature, is arranged in a center portion in the central region surrounded by the cuts 11. Moreover, resistances, capacitors, and the like that have low characteristic change are arranged on the outer peripheral region to the cuts 11. Regarding the temperature control elements 15, the heating chip resistances 4 and the power transistors 5 serving as heat sources, and the thermistor 6 for detecting temperature, are arranged in the central region inside the cuts 11, and the other components are arranged on the outer peripheral region to the cuts 11.

In this embodiment, as shown in FIG. 3, eight heating chip resistances 4 are arranged evenly on the inner side of the central region inside the cuts 11 in a square ring arrangement.

Figure 4:
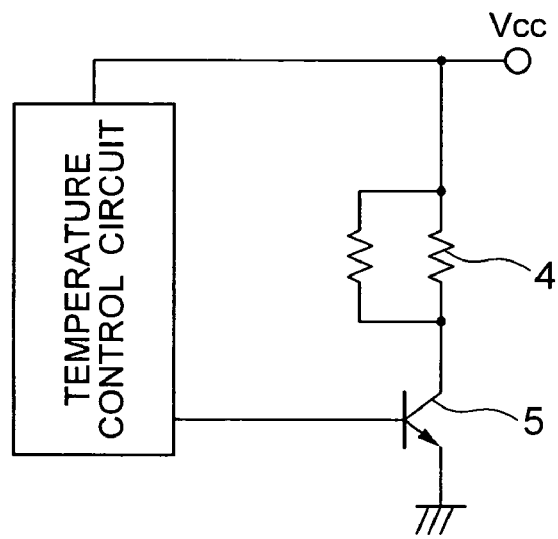
FIG. 4 is an example of a temperature control circuit of the first embodiment of the present invention.

In this case, as shown in FIG. 4, four sets of a unit comprising a pair of the heating chip resistances 4 connected between the power transistor 5 and an electric source Vcc, are arranged. Furthermore, the heating current to the heating chip resistances 4 is controlled by the base bias with respect to the power transistor 5, from the temperature control circuit including the thermistor 6. The thermistor 6 is arranged on the center portion of the central region of the circuit board 7 together with the voltage variable capacitance element 14A.

As shown in FIG. 1, the heat transfer plate 2 is made for example from an aluminum material that has a square shape in top view, and has a through hole 2A in the center, and an annular notch 2B that is L-shaped, surrounds the periphery thereof. The heat transfer plate 2 is fixed to the central region of the circuit board 7 on its bottom face with screws (not shown), and accommodates the voltage variable capacitance element 14A and the thermistor 6 in the through hole 2A. Also, lead wires 1a and 1b of the crystal oscillator 1 are inserted into the through hole 2A, and the periphery of the bottom face of the oscillator container is closely contacted with the heat transfer plate 2.

The heat sink 3 is made from a heat transfer resin of sheet shape having elasticity. In this embodiment, the heat sink sheet 3 is made from two heat sink sheets 3A and 3B. The first heat sink sheet 3A lies between the annular notch 2B of the heat transfer plate 2, and the heating chip resistances 4, and closely contacts with both. In this case, due to the elasticity of the heat sink sheet 3A, the heating chip resistances 4 are buried from over their upper face to the side faces, with the upper and side faces closely contacting with the lower face of the heat sink sheet 3A and the side faces of the heat transfer plate 2.

The second heat sink sheet 3B is provided on the lower surface of the heat transfer plate 2, and forms a close contact between the heat transfer plate 2 and the circuit board 7, with the lead wires 1a and 1b of the crystal oscillator 1 inserted into the hole 3a and 3b provided in the heat sink sheet 3B. Furthermore, a through hole 2A is formed at the center of the heat transfer plate 2 for accommodating the voltage variable capacitance element 14A and the thermistor 6, and this is filled with silicone S.

According to such a configuration, since the heat transfer plate 2 is provided between the heating chip resistance 4 and the bottom face of the crystal oscillator (oscillator container), the conventional constant temperature oven 12 in which the oscillator container is accommodated can be omitted. Therefore, thinning of the constant temperature oscillator can be facilitated because only the thickness of the heat transfer plate 2 basically adds to the height dimension. Furthermore, the circuit board 7, the heat sink sheet 3A, the heat transfer plate 2, and the crystal oscillator 1 are closely contacted with each other and integrated in this order, thus maintaining adequate heat transfer, and enabling functioning as a constant temperature type.

Also, here since the heating chip resistances 4 are fitted into the notch 2B provided in the heat transfer plate 2, the upper face and side faces of the heating chip resistances 4 and the notch 2B of the heat transfer plate 2 become opposing faces. Furthermore, because the heat sink sheet 3A is sandwiched between and in close contact with the heating chip resistance 4 and the notch 2B of the heat transfer plate 2, the heat from the heating chip resistances 4 is directly supplied to the heat transfer plate 2. Therefore, the heat from the heating chip resistances 4 can be supplied to the heat transfer plate 2 without loss and the oscillator container heated.

Moreover, because the notch 2B is provided in the peripheral portion of the heat transfer plate 2 in an annular shape, and a plurality of heating chip resistances 4 is evenly arranged around the notch 2B, the heat is evenly supplied to the bottom surface of the oscillator container without deviation, and a stable temperature distribution can be maintained. In this embodiment, a pair of the heating chip resistances 4 are connected in parallel between the power transistor 5 and the electric source Vcc, and four units of these are arranged. Therefore, compared to the case in which a single heating chip resistance is connected to a power transistor 5, the heat can be adequately dispersed, realizing an even temperature distribution on the bottom face of the oscillator container.

Furthermore, because the heat sink 3 is sheet shaped having elasticity, closer contacts of the heat sink sheet 3A with the heating chip resistances 4 and the heat transfer plate 2, and the heat sink sheet 3B with the circuit board 7 and the heat transfer plate 2, are obtained, thus improving the heat transfer characteristics. Moreover, because the heat transfer plate 2 is plate-shaped and of minimal heat capacity, this gives an oscillator with excellent starting characteristics.

As shown in FIG. 1, the through holes 3a and 3b for the lead wires 1a and 1b are provided in the heat sink sheet 3B. Moreover, the through holes 7c, 7d, 7e and 7f for the airtight terminals 8, and the through holes 7a and 7b for the lead wires 1a and 1b are provided in the circuit board 7. Furthermore, the through holes 10c, 10d, 10e and 10f for the airtight terminals 8 are provided in the base 10.

Second Embodiment

Figure 5:
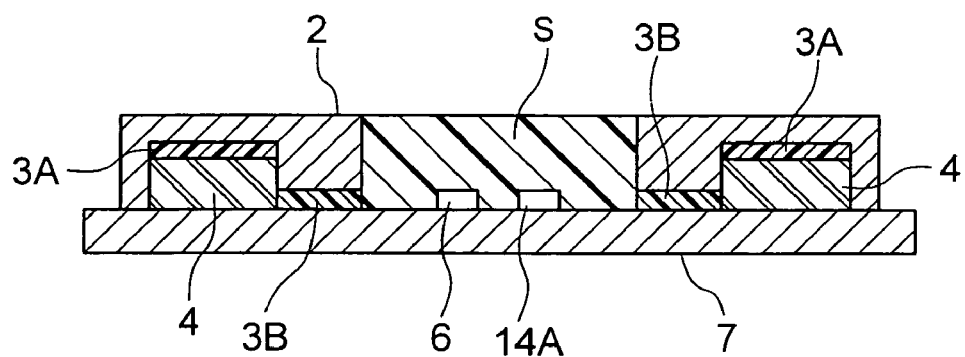
FIG. 5 is an enlarged view of the main parts of a heat transfer plate in a second embodiment of the constant temperature oscillator of the present invention.

As a structure of the heat transfer plate 2 used in a constant temperature oscillator of the present invention, in the case where there is enough space on the board to be installed, the heat transfer plate 2 shown in FIG. 5 having a concave portion covering all of the upper faces and the side faces of the heating chip resistances 4 and the power transistor 5 may be adopted. According to such a configuration, compared to the heat transfer plate 2 described in the above embodiment, more efficient heat transfer can be achieved because the heat produced from the heating chip resistances 4 can be received from their upper and side faces, and the heat is inhibited from escaping from the heat sources.

Figure 6:
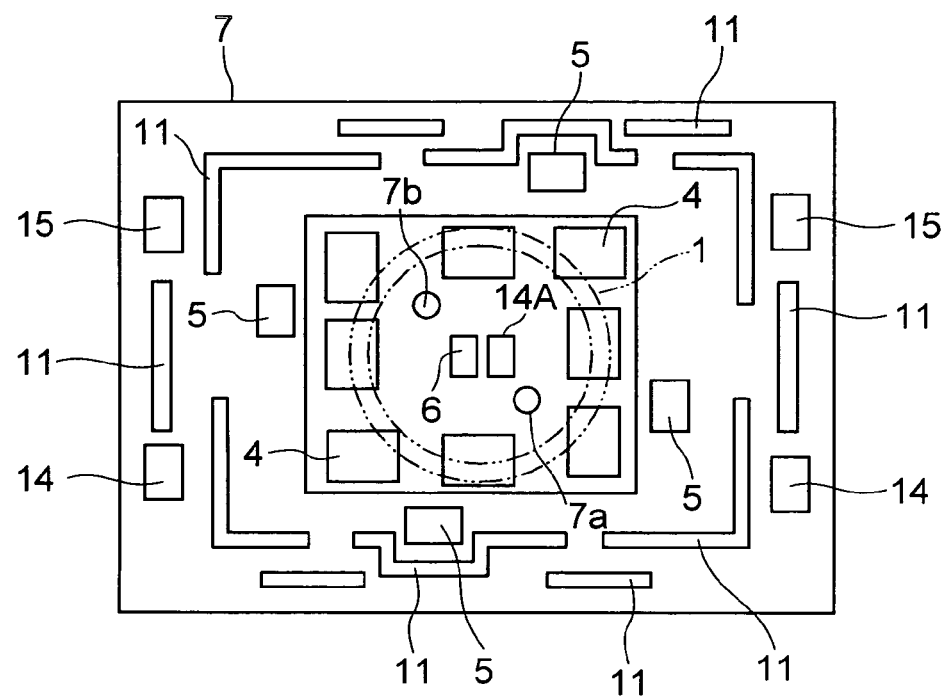
FIG. 6 is a top view of a circuit board for explaining one embodiment of the present invention.
Figure 7:
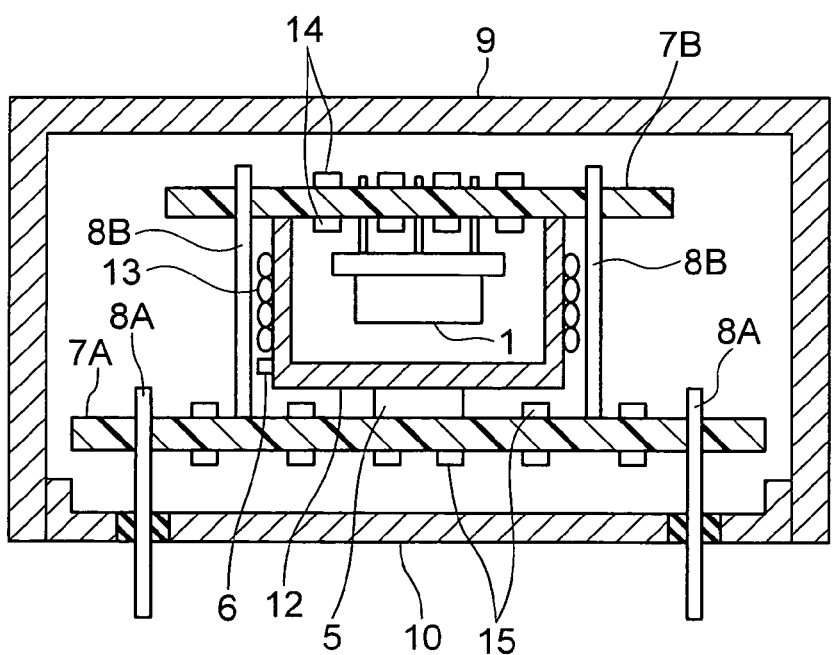
FIG. 7 is a partial sectional view of a conventional constant temperature oscillator.
Figure 8:
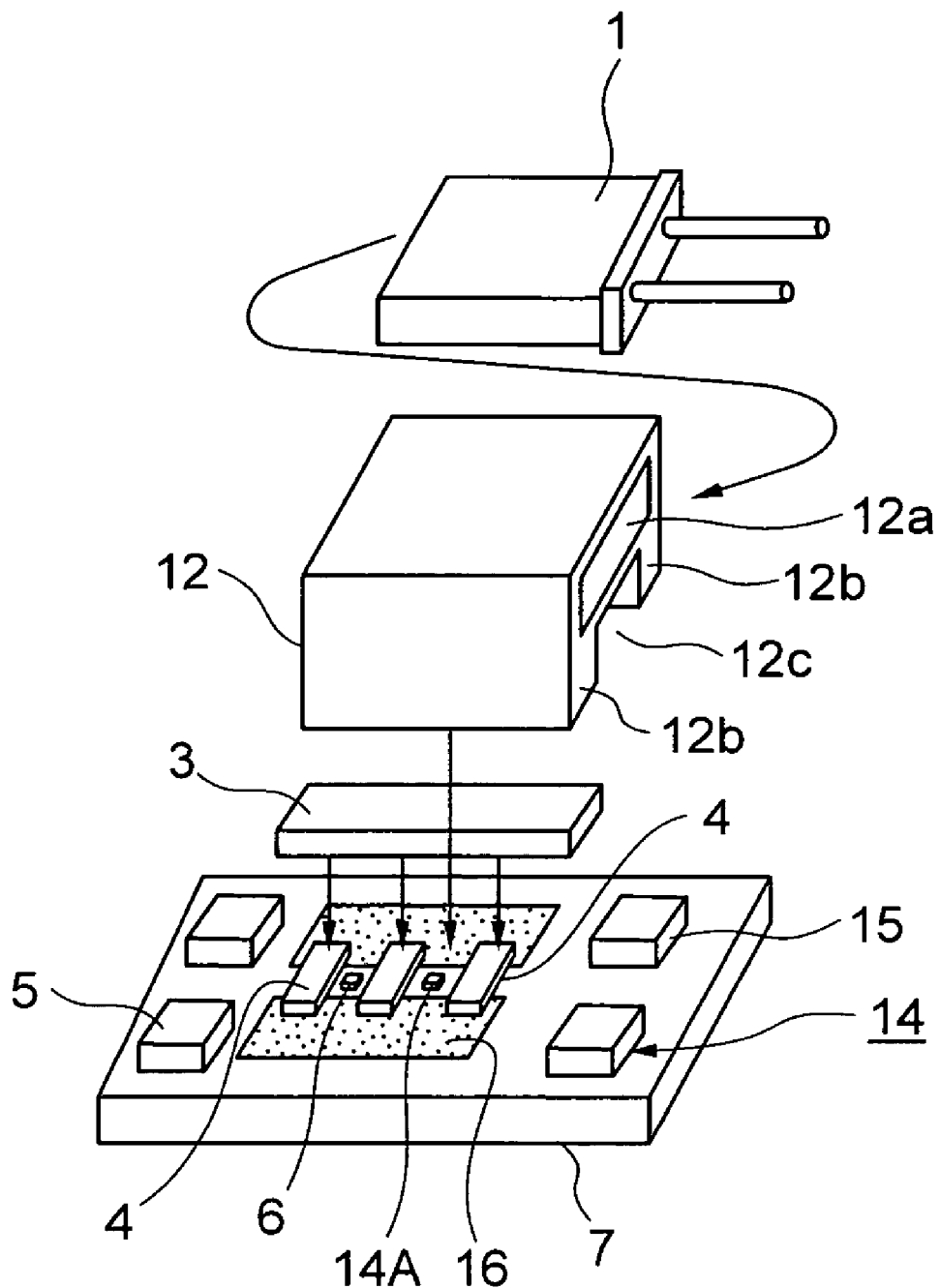
FIG. 8 is an exploded view of a main assembly of a constant temperature oscillator of another conventional example.

Furthermore, the cuts 11 in the circuit board 7 shown in FIGS. 1 and 3 are arranged surrounding the central region on which are arranged the heating chip resistances 4 and the power transistors 5 that are heat sources, the thermistor 6, and the voltage variable capacitance element 14A that are highly sensitive thermal elements. However, if necessary, they may be provided at the periphery thereof also surrounding the other oscillation element 14 and the temperature control element 15. In this case (refer to FIG. 6), doubling the cut 11 confines the heat and prevents heat radiation from the periphery, enabling improvement in efficiency.

Also, the heat sink 3 may be provided between and in close contact with the bottom face of the crystal oscillator (oscillator container) 1 and the heat transfer plate 2. In this case, the heat sink 3 need not be sheet shaped, and may be coated with a heat transfer resin and cured.

Furthermore, although the parallel connection shown in FIG. 4 is referred to as an arrangement of the heating chip resistances 4, series or series-parallel connection of the heating chip resistances 4 also realizes the even heat distribution on the bottom face of the oscillator container, due similarly to dispersion of the heat sources.

What is claimed is:

1. A constant temperature type crystal oscillator which comprises:
    a crystal oscillator that is provided upright on a circuit board, and which comprises a plurality of lead wires extending out from a bottom face of an oscillator container in which a crystal piece is hermetically sealed;
    an oscillation element arranged on said circuit board and configuring an oscillation circuit in conjunction with said crystal oscillator; and
    a temperature control element including at least a heating chip resistance and a thermistor, arranged on said circuit board, and configuring a temperature control circuit that keeps an operating temperature of said crystal oscillator constant, the circuit board having at least a single layer of cuts defined in regions thereof surrounding at least a region in which the heating chip resistance and thermistor are arranged;
    and which is provided with a heat transfer plate between said heating chip resistance and a bottom face of said oscillator container,
    wherein,
    said heat transfer plate has a notch into which said heating chip resistance is fitted, and
    a heat sink lies between said heat transfer plate and said heating chip resistance and closely contacts with them.

2. A crystal oscillator according to the claim 1, wherein in said temperature control circuit, a plurality of said heating chip resistances is connected between a power transistor and a power supply in parallel, in series, or in series-parallel.

3. A crystal oscillator according to the claim 2, wherein a plurality of said heating chip resistances and a plurality of sets of said power transistors are arranged on said circuit board.

4. A crystal oscillator according to claim 1, further comprising overlapping cuts defined in the circuit board in regions thereof surrounding at least a region in which the heating chip resistance and thermistor are arranged.

5. A constant temperature type crystal oscillator which comprises:
    a crystal oscillator that is provided upright on a circuit board, and which comprises a plurality of lead wires extending out from a bottom face of an oscillator container in which a crystal piece is hermetically sealed;
    an oscillation element arranged on said circuit board and configuring an oscillation circuit in conjunction with said crystal oscillator; and
    a temperature control element including at least a heating chip resistance and a thermistor, arranged on said circuit board, and configuring a temperature control circuit that keeps an operating temperature of said crystal oscillator constant;
    and which is provided with a heat transfer plate between said heating chip resistance and a bottom face of said oscillator container,
    wherein,
    said heat transfer plate has a notch into which said heating chip resistance is fitted, said notch being provided in a peripheral portion of said heat transfer plate in an annular shape, with a plurality of said heating chip resistances being evenly arranged around said notch; and wherein
    a heat sink lies between said heat transfer plate and said heating chip resistance and closely contacts with them.

6. A constant temperature type crystal oscillator which comprises:
    a crystal oscillator that is provided upright on a circuit board, and which comprises a plurality of lead wires extending out from a bottom face of an oscillator container in which a crystal piece is hermetically sealed;
    an oscillation element arranged on said circuit board and configuring an oscillation circuit in conjunction with said crystal oscillator; and
    a temperature control element including at least a heating chip resistance and a thermistor, arranged on said circuit board, and configuring a temperature control circuit that keeps an operating temperature of said crystal oscillator constant;
    and which is provided with a heat transfer plate between said heating chip resistance and a bottom face of said oscillator container,
    wherein,
    said heat transfer plate has a notch into which said heating chip resistance is fitted, and
    a heat sink lies between said heat transfer plate and said heating chip resistance and closely contacts with them, the heat sink being sheet-shaped having elasticity.

\* \* \* \* \*